(12) United States Patent
Iida et al.

(10) Patent No.: US 8,154,299 B2
(45) Date of Patent: Apr. 10, 2012

(54) DETERIORATION DETERMINATION CIRCUIT, POWER SUPPLY APPARATUS, AND DETERIORATION DETERMINATION METHOD OF SECONDARY BATTERY

(75) Inventors: Takuma Iida, Osaka (JP); Akihiro Taniguchi, Hyogo (JP); Takuya Nakashima, Osaka (JP)

(73) Assignee: Panasonic Corporation, Osaka (JP)

( * ) Notice: Subject to any disclaimer, the term of this patent is extended or adjusted under 35 U.S.C. 154(b) by 492 days.

(21) Appl. No.: 12/493,642

(22) Filed: Jun. 29, 2009

(65) Prior Publication Data

US 2010/0001693 A1    Jan. 7, 2010

(30) Foreign Application Priority Data

Jun. 30, 2008    (JP) .................. 2008-170498

(51) Int. Cl.
G01N 27/416    (2006.01)
H02J 7/00    (2006.01)
(52) U.S. Cl. ...................... 324/430; 320/132
(58) Field of Classification Search .......... 324/425–434; 320/132

See application file for complete search history.

(56) References Cited

U.S. PATENT DOCUMENTS

| | | | | |
|---|---|---|---|---|
| 6,441,619 B1 * | 8/2002 | Araki et al. | ................... | 324/427 |
| 6,850,038 B2 * | 2/2005 | Arai et al. | ..................... | 320/132 |
| 7,593,823 B2 * | 9/2009 | Iwane et al. | ..................... | 702/63 |
| 7,615,967 B2 * | 11/2009 | Cho et al. | ....................... | 320/132 |
| 7,733,063 B2 * | 6/2010 | Mizuno et al. | ................ | 320/136 |

FOREIGN PATENT DOCUMENTS

JP    2001-174532    6/2001

* cited by examiner

*Primary Examiner* — Richard V Muralidar
(74) *Attorney, Agent, or Firm* — McDermott Will & Emery LLP (57) ABSTRACT

Provided is a deterioration determination circuit configured by including: an SOC detection unit for detecting an SOC of a secondary battery; an internal resistance detection unit for detecting an internal resistance value of the secondary battery; a first determination unit for determining the status of deterioration of the secondary battery based on the internal resistance value detected by the internal resistance detection unit when the SOC detected by the SOC detection unit is within a range of a pre-set first range; a second determination unit for determining the status of deterioration of the secondary battery based on the internal resistance value detected by the internal resistance detection unit when the SOC detected by the SOC detection unit is within a range of a pre-set second range as a range of an SOC, in which a variation of the internal resistance of the second battery in relation to a variation of the SOC of the secondary battery is different from the first range; and a final determination unit for ultimately determining that the secondary battery is deteriorated when the first determination unit determines that the secondary battery is of the deteriorated status and the second determination unit additionally determines that the secondary battery is of the deteriorated status.

8 Claims, 5 Drawing Sheets

DETERIORATION DETERMINATION CIRCUIT, POWER SUPPLY APPARATUS, AND DETERIORATION DETERMINATION METHOD OF SECONDARY BATTERY

BACKGROUND OF THE INVENTION

1. Field of the Invention

The present invention relates to a deterioration determination circuit for determining the status of determination of a secondary battery, a power supply apparatus comprising such a deterioration determination circuit, and a deterioration determination method for a secondary battery.

2. Description of the Background Art

In recent years, a secondary battery is being combined with a solar battery or a generator and broadly used as a power system. A generator is driven with natural energy such as wind power or water power, or artificial power such as an internal combustion engine. This kind of power system including a secondary battery accumulates surplus electric power in the secondary battery, and a loading device supplies electric power from the secondary battery as needed so as to improve the energy efficiency.

As an example of this kind of system, there is a photo voltaic system. With this photo voltaic system, when the solar electric power generation is greater than the power consumption of the loading device, it charges the secondary battery with the surplus power. Contrarily, if the electric power generation is smaller than the power consumption of the loading device, it drives the loading device by outputting electric power from the secondary battery in order to compensate for the insufficient electric power.

As described above, with a photo voltaic system, since the surplus power that was not used conventionally can be accumulated in the secondary battery, it is able to improve the energy efficiency in comparison to power systems that do not use a secondary battery.

With this kind of photo voltaic system, when the secondary battery is fully charged, loss will arise since the surplus power can no longer be charged. Thus, charge control is being performed so that the state of charge (hereinafter referred to as the "SOC") of the secondary battery will not become 100% in order to efficiently charge the surplus power in the secondary battery. In addition, charge control is also being performed so that the SOC will not become 0% (zero percent) in order to be able to drive the loading device as necessary. Specifically, under normal circumstances, charge control is performed so that the SOC in the secondary battery fluctuates within the range of 20% to 80%.

Moreover, a hybrid electric vehicle (HEV) that uses an engine and a motor also uses this kind of principle. An HEV drives the dynamo with surplus engine output and charges the secondary battery when the output from the engine is large in relation to the power that is required for the traveling motion. In addition, during the braking or deceleration of the vehicle, the HEV charges the secondary battery by using a motor as the dynamo.

Furthermore, load leveling power sources and plug-in hybrid vehicles that utilize night power have also been attracting attention recently. A load leveling power source is a system with low power consumption, which stores electric power in the secondary battery at night when the electric power rate is cheap, and utilizes the stored electric power during the day when the power consumption is highest. As a result of smoothing the power consumption, the electric power generation of the electric power is evened out, which in turn contributes to the efficient operation of the electric power facilities and reduction in facility investment.

In addition, a plug-in hybrid vehicle utilizes night power and runs mainly as an EV which supplies electric power from the secondary battery while running in the urban area with inferior mileage, and runs as an HEV that utilizes an engine and a motor during long-distance drives so as to reduce the total $CO_2$ emission.

In many cases, a secondary battery that is mounted on this kind of power system is configured by serially connecting a plurality of secondary batterys (electrical batterys, etc.).

Meanwhile, if deterioration advances in this kind of secondary battery, the internal resistance will increase. And when the internal resistance of the secondary battery increases, the heating value of the secondary battery will increase. Consequently, even if the secondary battery is used in the same manner as its initial state without any deterioration, if the deterioration advances, the temperature will rise pursuant to the heat generation of the secondary battery, and the safety will deteriorate.

Thus, in order ensure the safety of the secondary battery, it is desirable to use the secondary battery in accordance with its deteriorated state such as by detecting the deterioration of the secondary battery and, for instance, if the deterioration has advanced, limiting the current value to be input to and output from the secondary battery.

As a means for detecting the deterioration of the secondary battery, known is a method of calculating the internal resistance of the secondary battery, and determining that deterioration has occurred if such internal resistance exceeds a prescribed value (for instance, refer to Japanese Patent Laid-Open Publication No. 2001-174532).

Meanwhile, the internal resistance of the secondary battery changes according to the SOC independently from the deterioration. Thus, if the deterioration of the secondary battery is determined based on the internal resistance value independently from the SOC as described in Japanese Patent Laid-Open Publication No. 2001-174532, there is an inconvenience in that this will reduce the accuracy of the deterioration determination.

And if the secondary battery is erroneously determined to be deteriorated, as a result of the current to be input to and output from the secondary battery being limited, for instance, the convenience of higher-level devices may deteriorate as a result of not being able to sufficiently accumulate the surplus power supplied from the generator or the power supply to the loading device being insufficient.

SUMMARY OF THE INVENTION

Thus, an object of the present invention is to provide a deterioration determination circuit, a power supply apparatus, and a deterioration determination method of a secondary battery capable of improving the detection accuracy of the deterioration of the secondary battery.

The deterioration determination circuit according to one aspect of the present invention comprises: an SOC detection unit for detecting an SOC of a secondary battery; an internal resistance detection unit for detecting an internal resistance value of the secondary battery; a first determination unit for determining the status of deterioration of the secondary battery based on the internal resistance value detected by the internal resistance detection unit when the SOC detected by the SOC detection unit is within a range of a pre-set first range; a second determination unit for determining the status of deterioration of the secondary battery based on the internal resistance value detected by the internal resistance detection unit when the SOC detected by the SOC detection unit is within a range of a pre-set second range as a range of an SOC, in which a variation of the internal resistance of the second battery in relation to a variation of the SOC of the secondary battery is different from the first range; and a final determination unit for ultimately determining that the secondary battery is deteriorated when the first determination unit determines that the secondary battery is of the deteriorated status and the second determination unit additionally determines that the secondary battery is of the deteriorated status.

Moreover, the deterioration determination method for a secondary battery according to another aspect of the present invention comprises: an SOC detection step of detecting an SOC of a secondary battery; an internal resistance detection step of detecting an internal resistance value of the secondary battery; a first determination step of determining the status of deterioration of the secondary battery based on the internal resistance value detected in the internal resistance detection step when the SOC detected in the SOC detection step is within a range of a pre-set first range; a second determination step of determining the status of deterioration of the secondary battery based on the internal resistance value detected in the internal resistance detection step when the SOC detected in the SOC detection step is within a range of a pre-set second range as a range of an SOC, in which a variation of the internal resistance of the second battery in relation to a variation of the SOC of the secondary battery is different from the first range; and a final determination step of ultimately determining that the secondary battery is deteriorated when the first determination step determines that the secondary battery is of the deteriorated status and the second determination step additionally determines that the secondary battery is of the deteriorated status.

In addition, the power supply apparatus according to yet another aspect of the present invention comprises the foregoing deterioration determination circuit, the foregoing secondary battery, and a charge-discharge control unit for controlling at least either the charge or discharge of the secondary battery in accordance with the determination result of the determination by the final determination unit.

According to the foregoing deterioration determination circuit, the power supply apparatus, and the deterioration determination method of a secondary battery, since with regard to the SOC of the secondary battery the secondary battery is ultimately determined to be deteriorated when the obtained internal resistance values both show the deterioration of the secondary battery respectively in a first range and a second range in which the variation in the internal resistance of the secondary battery in relation to the variation of the SOC is mutually different; that is, the level that the SOC of the secondary battery affects the internal resistance value is mutually different, the influence of the SOC on the ultimate deterioration determination result is reduced. Consequently, it is possible to improve the accuracy of the deterioration determination of the secondary battery.

DETAILED DESCRIPTION OF THE PREFERRED EMBODIMENTS OF THE INVENTION

Figure 1:
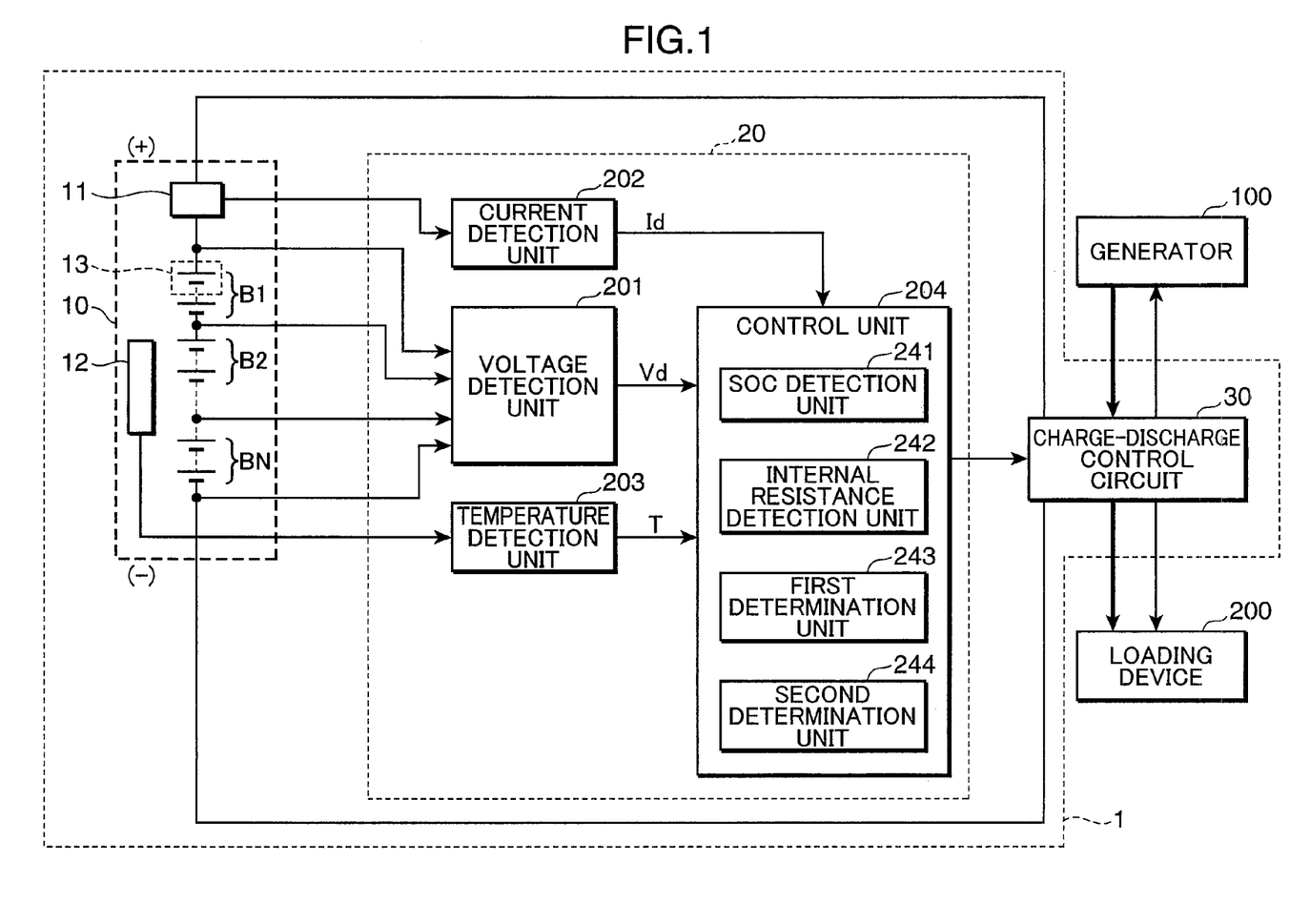
FIG. 1 is a block diagram showing an example of the configuration of a deterioration determination circuit applying the deterioration determination method of a secondary battery and a power supply apparatus employing such deterioration determination circuit according to an embodiment of the present invention.

Embodiments of the present invention are now explained with reference to the attached drawings. Incidentally, the following embodiments are merely embodied examples of the present invention, and are not intended to limit the technical range of this invention in any way. In addition, configurations that are given the same reference numeral in the respective drawings show that they are the same configuration, and the explanation thereof is omitted. FIG. 1 is a block diagram showing an example of the configuration of a deterioration determination circuit applying the deterioration determination method of a secondary battery and a power supply apparatus employing such deterioration determination circuit according to an embodiment of the present invention.

The power supply apparatus 1 shown in FIG. 1 comprises a secondary battery 10, a deterioration determination circuit 20, and a charge-discharge control circuit 30 (charge-discharge control unit). The power supply apparatus 1 can be used in the backup power supply apparatus of a photo voltaic system or UPS, as well as in the power system of various battery-powered devices and system such as portable personal computers, digital cameras, mobile phones, electric vehicles, hybrid cars and the like.

The deterioration determination circuit 20 is configured, for example, as an ECU (Electric Control Unit). The deterioration determination circuit 20 comprises a voltage detection unit 201, a current detection unit 202, a temperature detection unit 203, and a control unit 204. A generator 100 and a loading device 200 are connected to the charge-discharge control circuit 30. The generator 100 is, for instance, a solar generator (solar battery), or a dynamo or the like that is driven by natural energy such as wind power or water power, or artificial power of an engine or the like. Incidentally, the charge-discharge control circuit 30 may be connected to a commercial power source instead of the generator 100.

The loading device 200 may also be various types of loads that are driven by the electric power supplied from the power supply apparatus 1 and, for instance, may also be the loading equipment of a motor or a backup target.

The charge-discharge control circuit 30 charges the surplus power from the generator 100 and the regenerative electric power generated in the loading device 200 in the secondary battery 10. The charge-discharge control circuit 30 also supplies insufficient electric power from the secondary battery 10 to the loading device 200 if the consumption current of the loading device 200 increases drastically or the electric power generation of the generator 100 decreases and the electric power required by the loading device 200 exceeds the output of the generator 100.

Moreover, under normal circumstances, the charge-discharge control circuit 30 controls the charge/discharge of the secondary battery 10 so that the SOC of the secondary battery 10 will be within a range of roughly 20 to 80% based on the SOC of the secondary battery 10 that is sent from the control unit 204. If the power supply apparatus 1 is to be used as a power supply apparatus of a load leveling power source or a plug-in hybrid vehicle that utilizes night power, the charge-discharge control circuit 30 charges the SOC of the secondary battery 10 until it becomes 100%, and discharges the secondary battery 10 when the loading device 200 requires energy.

In addition, when the charge-discharge control circuit 30 receives a signal from the control unit 204 showing the deterioration of the secondary battery 10, it reduces the charge-discharge current of the secondary battery 10 so as to improve the safety.

The secondary battery 10 is configured, for example, as a battery pack housing serially connected N-number of battery blocks B1, B2, . . . , BN, a current sensor 11, and a temperature sensor 12 in a case (box) not shown. Moreover, the battery blocks B1, B2, . . . , BN are respectively configured by electrically and serially connecting a plurality of electrical batterys 13.

As the electrical battery 13 used may be an alkali battery such as a nickel hydride battery or an organic battery such as a lithium ion battery. Incidentally, the secondary battery 10 will suffice so as long as it included at least one electrical battery 13, and there is no particular limitation in the number N of battery blocks and the number of electrical batterys 13. Moreover, the electrical batterys 13 and the battery block may be connected in parallel, or connected in a combination of serial and parallel.

In the foregoing case, the secondary battery that is claimed in the claims may be the secondary battery 10, or the battery blocks B1, B2, . . . , BN, or the electrical batterys 13. Incidentally, in the ensuing explanation, when collectively referring to the battery blocks B1, B2, . . . , BN, the suffix will be omitted and indicated as the battery block B, and shown with reference numerals with the suffix when referring to the individual configurations.

Meanwhile, an alkali battery such as a nickel hydride battery or an organic battery such as a lithium ion battery is characterized in that the variation of the internal resistance of the secondary battery in relation to the variation of the SOC of that secondary battery changes according to the level of deterioration.

Figure 2:
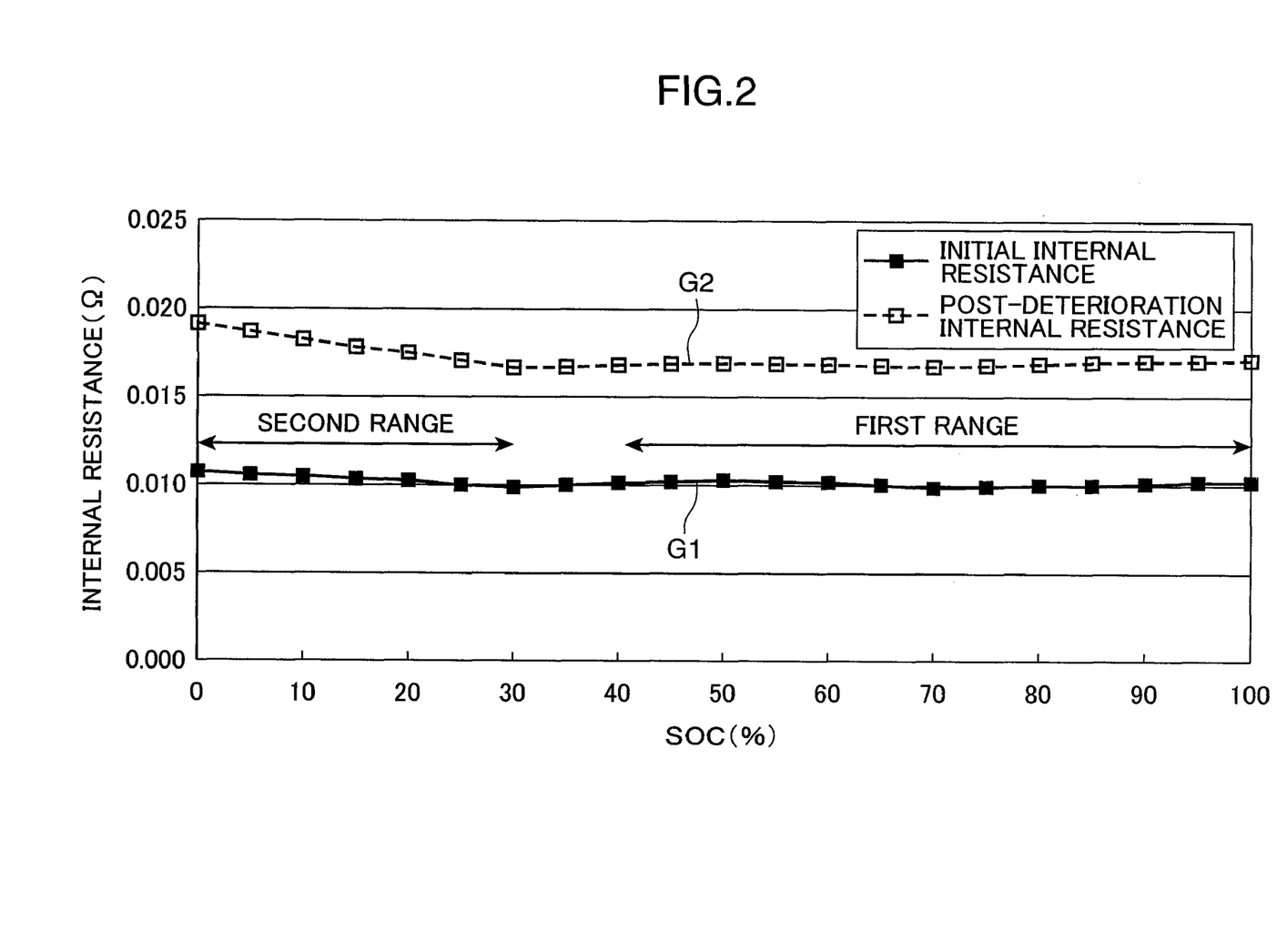
FIG. 2 is a graph showing an example of the relationship of the SOC and internal resistance of the secondary battery.

FIG. 2 is a graph showing an example of the relationship of the SOC and the internal resistance of the secondary battery. In FIG. 2, the horizontal axis shows the SOC (%) and the vertical axis shows the internal resistance ($\Omega$) of the secondary battery. Graph G1 shows the relationship of the SOC and the internal resistance in the initial state without any deterioration, and graph G2 shows the relationship of the SOC and the internal resistance after deterioration.

Foremost, in graph G2, the overall resistive value is greater than graph G1, and it can be understood that, with the secondary battery, the internal resistance value will increase the more the deterioration advances. In addition, in regions where the SOC is 30% or higher, the internal resistance is approximately of a fixed value (approximately zero inclination in graphs G1 and G2) in relation to the change in the SOC in both graphs G1 and G2.

Meanwhile, in regions where the SOC is less than 30%, the internal resistance will increase the smaller the SOC becomes (negative inclination in graphs G1 and G2) in both graphs G1 and G2, and the variation in graph G2 with advanced deterioration is greater than the variation of graph G1 of an initial state (considerable inclination in the negative direction).

Here, for example, among the region in which the SOC exceeds 30% which is a region where the internal resistance is approximately a fixed value in relation to the change in the SOC, for instance, the region exceeding 40% giving margin to the 30% as the boundary value is set as a first range. An the region in which the SOC is less than 30% which is a region with a larger variation in the internal resistance of the secondary battery in relation to the variation of the SOC of that secondary battery in comparison to the first range is set as a second range.

The current sensor 11 is configured, for example, from a resistance element, a current transformer and the like which are serially connected to the battery block B, detects the current flowing from the battery block B, and output this current value as a voltage signal to the current detection unit 202. The temperature sensor 12 is configured, for example, as a thermocouple, a thermistor or the like, and output analog information such as the voltage and resistive value according to the temperature of the battery block B to the temperature detection unit 203.

The voltage detection unit 201 is configured, for instance, using an analog-digital converter, and measures the respective terminal voltages Vt1, Vt2, . . . , VtN of the battery blocks B1, B2, . . . , BN. The voltage detection unit 201 converts the measured terminal voltages Vt1, Vt2, . . . , VtN into digital values at a pre-set cycle and outputs the digital values to the control unit 204. Incidentally, in the ensuing explanation, when collectively referring to the terminal voltages Vt1, Vt2, . . . , VtN, the suffix will be omitted and indicated as the terminal voltage Vt, and shown with reference numerals with the suffix when referring to the individual configurations.

Although a case was explained where the voltage detection unit 201 measures the terminal voltage for each battery block, it may also measure the terminal voltage value for each electrical battery 13, or measure the terminal voltage of the overall secondary battery 10.

The current detection unit 202 is configured, for example, from an analog-digital converter, and uses the current sensor 11 to measure the charge-discharge current I of the secondary battery 10 in a prescribed cycle. The current detection unit 202 converts the measured charge-discharge current I from an analog signal into a digital signal, and outputs this as a charge-discharge current value Id including the codes C (Charge)/D (Discharge) showing the charge direction (+) and discharge direction (−). The data output from the current detection unit 202 to the control unit 204 is also performed at a predetermined cycle as with the data output from the voltage detection unit 201.

The temperature detection unit 203 is configured, for example, from an analog-digital converter, a resistive value measuring circuit or the like, and uses the temperature sensor 12 to measures the temperature within the secondary battery 10 at a prescribed cycle. The temperature detection unit 203 converts the measured temperature from an analog signal into a digital signal and outputs this as a temperature value T to the control unit 204 in a predetermined cycle.

The control unit 204 is configured, for example, from a CPU (Central Processing Unit) that executes prescribed arithmetic processing, a non-volatile ROM (Read Only Memory) storing prescribed control programs, a RAM (Random Access Memory) for temporarily storing data, a timer circuit, a peripheral circuit and the like.

The control unit 204 will function as an SOC detection unit 241, an internal resistance detection unit 242, a first determination unit 243, and a second determination unit 244 by executing the control programs stored in the ROM.

The control unit 204 performs the preliminary determination of the deterioration of the secondary battery 10 in accordance with the internal resistance value when the SOC is in the first range based on the SOC detected with the SOC detection unit 241 and the internal resistance detected with the internal resistance detection unit 242. If the internal resistance rises higher than the initial state in the preliminary determination and the secondary battery 10 is determined to be deteriorated, the control unit 204 performs the main determination of the deterioration of the secondary battery 10 in accordance with the internal resistance value when the SOC is in the second range.

Then, if the internal resistance rises higher than the initial state even in the main determination and the secondary battery 10 is determined to be deteriorated; that is, if the secondary battery 10 is determined to be deteriorated in both the preliminary determination (SOC is the first range) and the main determination (SOC is the second range), it is ultimately determined that the secondary battery 10 and the electrical batterys 13 configuring the secondary battery 10 are deteriorated, and a signal showing the deterioration determination is output to the charge-discharge control circuit 30.

The SOC detection unit 241 calculates the accumulated charge Q by continuously accumulates the charge-discharge current value Id output from the current detection unit 202. During this accumulation, if the code C/D that was received together with the charge-discharge current value Id shows the charge direction (+) the charge efficiency (coefficient that is smaller than 1; for instance, 0.8) is multiplied to the charge-discharge current value Id before the accumulation. The SOC detection unit 241 calculates the SOC of the secondary battery 10 by calculating the ratio of the accumulated charge Q in relation to the full charge capacity of the secondary battery 10, and then stores this in the RAM.

Incidentally, the SOC detection unit 241 may also calculate the SOC of the respective battery blocks B1, B2, ..., BN as SOC 1, SOC 2, ..., SOC N for each battery block, or calculate the SOC for each electrical battery 13, or collectively calculate the SOC of the overall secondary battery 10.

Figure 3:
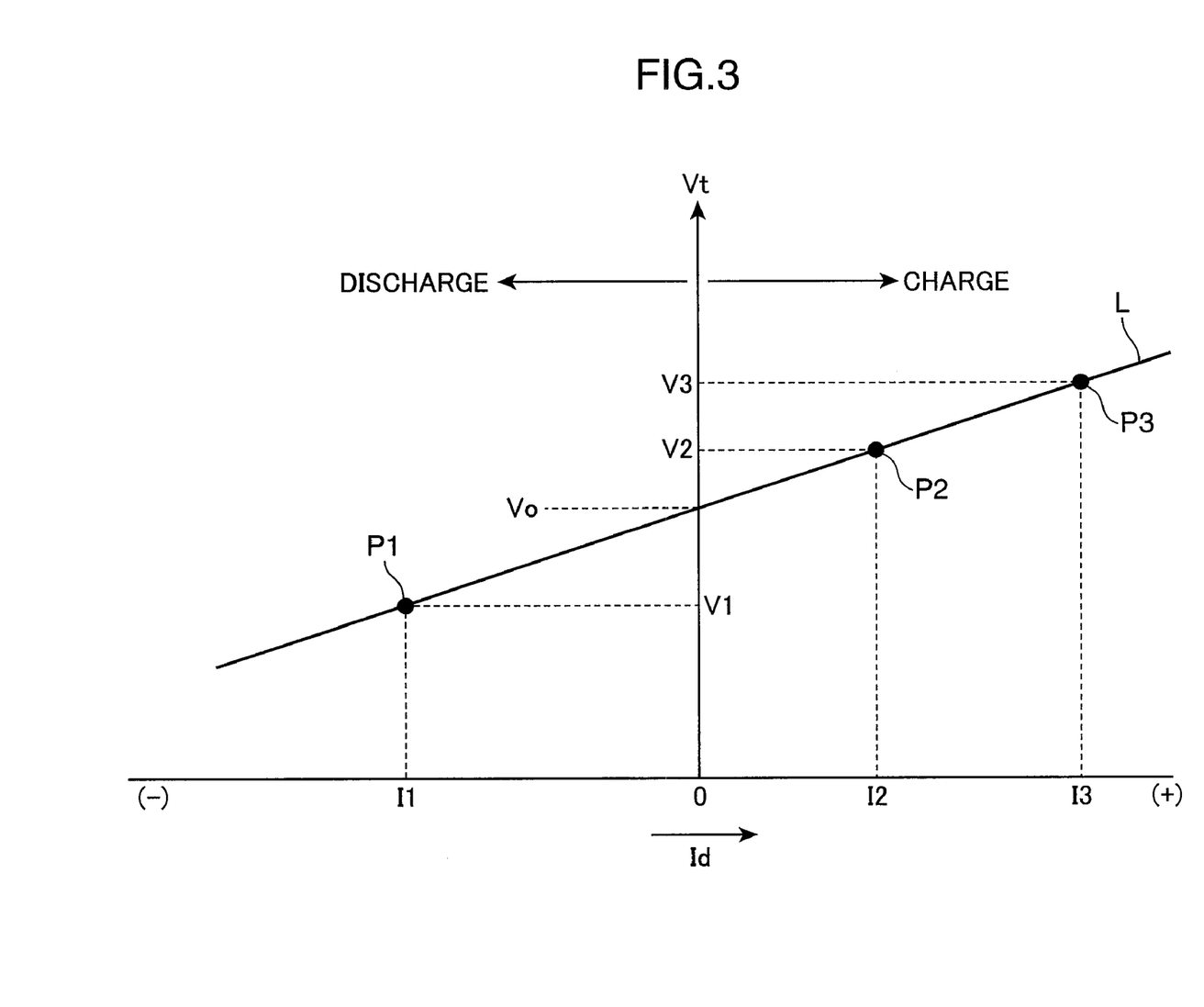
FIG. 3 is an explanatory diagram explaining an example of another SOC calculation method based on the SOC detection unit.

Moreover, although in the foregoing example the SOC detection unit 241 seeks the SOC using the accumulated charge Q, it may also detect the SOC with other methods. FIG. 3 is an explanatory diagram explaining an example of another SOC calculation method based on the SOC detection unit 241.

The SOC detection unit 241 creates a regression line by acquiring a plurality of sets of the terminal voltage Vt and the charge-discharge current value Id. FIG. 3 shows an example of creating the regression line L from the data P1, P2, P3 by acquiring data P1 in which the charge-discharge current value Id is I1 and the terminal voltage Vt is V1, data P2 in which the charge-discharge current value Id is I2 and the terminal voltage Vt is V2, and data P3 in which the charge-discharge current value Id is I3 and the terminal voltage Vt is V3.

Subsequently, the SOC detection unit 241 acquires a voltage value in which the charge-discharge current value Id becomes zero in the regression line L as the no-load voltage Vo. The SOC detection unit 241 thereafter calculates the electromotive force Vemf of the secondary battery 10 by subtracting the internal resistance of the secondary battery 10 calculated with the internal resistance detection unit 242 and the voltage drop arising from the polarization component from the no-load voltage Vo. Moreover, the SOC detection unit 241 may also refer to the electromotive force-SOC characteristic table showing the correspondence relation of the electromotive force Vemf and the SOC of the secondary battery 10 which is sought in advance by way of experimentation, and calculate the SOC of the secondary battery 10 by acquiring the SOC corresponding to the calculated electromotive force Vemf.

Here, since the correspondence relation of the electromotive force Vemf and the SOC will change in accordance with the temperature of the secondary battery 10, the electromotive force-SOC characteristic table for each temperature and a correction factor according to the temperature may be stored in the ROM in advance. In usages where the temperature of the secondary battery 10 will change considerably, the calculation accuracy of the SOC may be improved by correcting the influence of the temperature by using the electromotive force-SOC characteristic table according to the temperature value T based on such temperature value T output from the temperature detection unit 203, or using the correction factor according to the temperature value T.

The internal resistance detection unit 242 calculates the internal resistance of the battery blocks B1, B2, ..., BN by dividing the terminal voltage Vt by the charge-discharge current value Id based on the charge-discharge current value Id output from the current detection unit 202 and the terminal voltage Vt output from the voltage detection unit 201.

Otherwise, the internal resistance detection unit 242 may, as with the SOC detection unit 241 described above, create the regression line L shown in FIG. 3 for each battery block. Or, the inclination of each regression line L may be acquired as the internal resistance values R1, R2, RN of the battery blocks B1, B2, ..., BN.

The first determination unit 243, as the preliminary determination processing, calculates the ratio of the internal resistance value of the respective battery blocks detected with the internal resistance detection unit 242 in relation to the initial internal resistance value of the respective battery blocks in the initial state as the first deterioration level D1 if the SOC of the respective battery blocks detected with the SOC detection unit 241 is within the range of the first range. If the first deterioration level D1 exceeds a pre-set deterioration reference value γ, the first determination unit 243 preliminarily determines that the relevant battery block is deteriorated.

The second determination unit 244 starts the main determination if the first determination unit 243 determines that at least one of the battery blocks is deteriorated. When the second determination unit 244 starts the main determination, it calculates the ratio of the internal resistance value of the respective battery blocks detected with the internal resistance detection unit 242 in relation to the initial internal resistance value of the respective battery blocks in the initial state as the second deterioration level D2 if the SOC of the respective battery blocks detected with the SOC detection unit 241 is within the range of the second range. If the second deterioration level D2 exceeds the deterioration reference value ε, the second determination unit 243 ultimately determines that the relevant battery block is deteriorated. In the foregoing case, the second determination unit 244 also corresponds to an example of the final determination unit.

Figure 4:
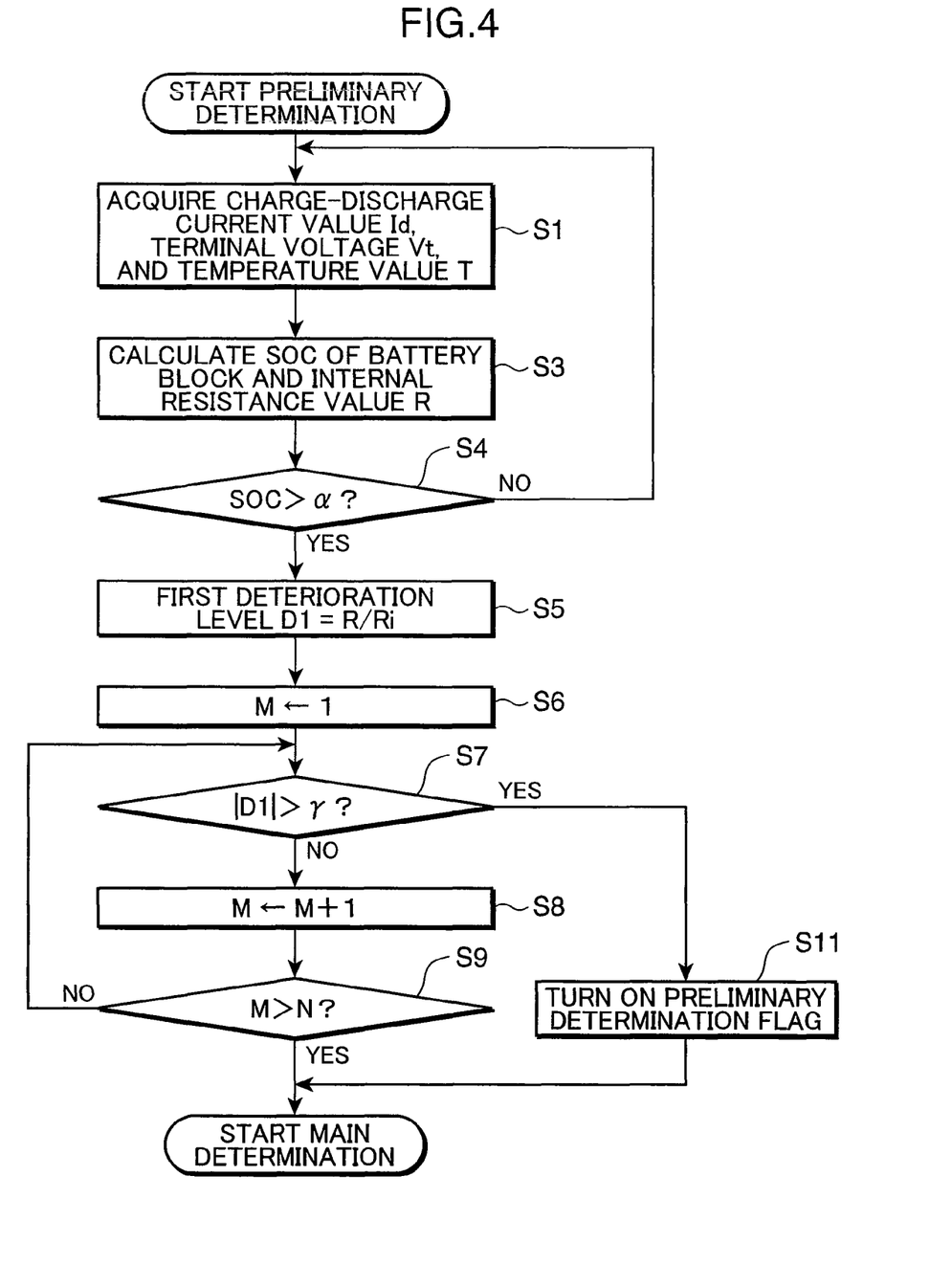
FIG. 4 is a flowchart showing an example of the operation of the first determination unit illustrated in FIG. 1.

The operation of executing the deterioration determination method of the secondary battery with the power supply apparatus 1 shown in FIG. 1 is now explained. FIG. 4 is a flowchart showing an example of the operation of the first determination unit 243 shown in FIG. 1. Foremost, the voltage detection unit 201 acquires the terminal voltages Vt1, Vt2, ..., VtN, the temperature detection unit 203 acquires the temperature value T, the current detection unit 202 acquires the charge-discharge current value Id, and the foregoing terminal voltages Vt1, Vt2, VtN, the temperature value T, and the charge-discharge current value Id are output to the SOC detection unit 241 and the internal resistance detection unit 242 (step S1).

Subsequently, the SOC 1, SOC 2, ..., SOC N of the respective battery blocks are calculated with the SOC detection unit 241 according to the foregoing terminal voltages Vt1, Vt2, ..., VtN, the temperature value T, and the charge-discharge current value Id, and the internal resistance values R1, R2, ..., RN of the respective battery blocks are calculated with the internal resistance detection unit 242 (step S3).

Subsequently, the first determination unit 243 determines whether the SOC 1, SOC 2, SOC N exceed a pre-set first range identification reference value α (step 4). Here, the first range identification reference value α shows the lower limit of the first range, and is set, for instance, to 40%. If any one of the SOC 1, SOC 2, ..., SOC N is greater than the first range identification reference value α; that is, if it is within the first range, the first determination unit 243 proceeds to step S5 in order to execute the deterioration determination (step S4; YES).

Meanwhile, if all of the SOC 1, SOC 2, ..., SOC N are less than the first range identification reference value α (step S4; NO); that is, if all of the SOC 1, SOC 2, ..., SOC N are outside the first range, the first determination unit 243 returns to step S1, and executes the re-measurement of the terminal voltage Vt, the charge-discharge current value Id, and the temperature value T with the voltage detection unit 201, the current detection unit 202, and the temperature detection unit 203.

At step S5, the first determination unit 243 calculates the first deterioration level D1 of the respective battery blocks under the condition that the SOC is within the first range by respectively dividing the internal resistance values R1, R2, ..., RN calculated with the internal resistance detection unit 242 by the initial internal resistance value R1 (step S5). The initial internal resistance value R1 is stored in the ROM by preliminarily measuring the internal resistance value of the battery blocks in a state with no deterioration such as during the shipment of the product.

The first determination unit 243 is initialized by substituting the variable M with 1 (step S6). The first determination unit 243 thereafter compares the first deterioration level D1 of the No. M battery block BM with the deterioration reference value γ (step S7). The deterioration reference value γ is obtained, for example, by preliminarily measuring the internal resistance value of the electrical battery 13 in which the deterioration has advanced and the charge-discharge current should be limited, and the internal resistance value of the electrical battery 13 in the initial state without any deterioration in a state where the SOC is charged to be within the first range, and dividing the internal resistance value of the deteriorated electrical battery 13 by the internal resistance value of the initial state. The deterioration reference value γ obtained as described above is stored in the ROM in advance.

If the first deterioration level D1 of the battery block BM is less than the deterioration reference value γ (step S7; NO), 1 is added to the variable M in order to perform the deterioration determination of the subsequent battery block (step S8), and the routine proceeds to step S9.

At step S9, the first determination unit 243 compares the variable M with the number of blocks N of the battery block B. If the variable M exceeds the number of blocks N (step S9; YES); that is, after the deterioration determination of all battery blocks is complete, the first determination unit 243 determines that the preliminary determination processing ended normally and proceeds to the main determination.

Meanwhile, at step S7, it is determined that the main determination is required only when the first determination unit 243 determines that the first deterioration level D1 is exceeding the deterioration reference value γ, the preliminary determination flag is turned ON (step S11), and the routine proceeds to the main determination. Meanwhile, at step S9, if the variable M has not yet exceeded the number of blocks N of the battery block (step S9; NO), the first determination unit 243 returns to step S7 and executes the deterioration determination of the subsequent battery block.

As described above, the main determination is executed in the main determination processing described later only if any one of the battery blocks is determined to be in a deteriorated state in the preliminary determination at step S7 and the preliminary determination flag is turned ON.

Figure 5:
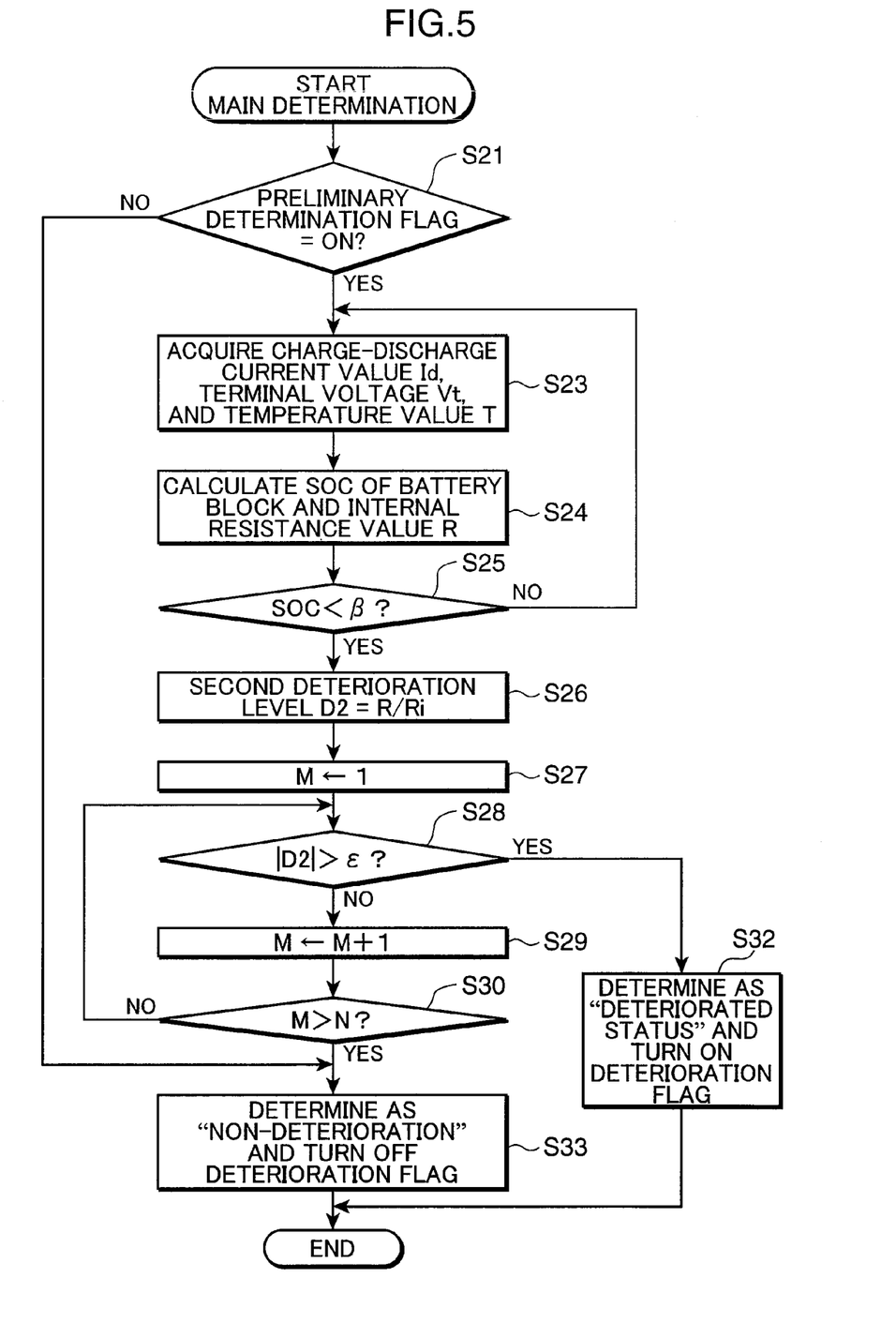
FIG. 5 is a flowchart showing an example of the operation of the second determination unit illustrated in FIG. 1.

FIG. 5 is a flowchart showing an example of the operation of the second determination unit 244 shown in FIG. 1. Foremost, when the second determination unit 244 starts the main determination processing, it determines whether the preliminary determination flag is turned ON (step S21). If the preliminary determination flag is turned OFF (step S21; NO), second determination unit 244 proceeds to step S33 without executing the main determination, and, after determining the non-deterioration of the secondary battery 10 and turning OFF the deterioration flag (step S33), ends the processing. Meanwhile, if the preliminary determination flag is turned ON (step S21; YES), second determination unit 244 proceeds to step S23.

Based on the processing of steps S23 and S24, the SOC 1, SOC 2, ..., SOC N of the respective battery blocks and the internal resistance values R1, R2, ..., RN of the respective battery blocks are calculated. Incidentally, since steps S23 and S24 are the same as steps S1 and S3, the explanation thereof is omitted.

Subsequently, the second determination unit 244 determines whether the SOC 1, SOC 2, SOC N exceed a pre-set second range identification reference value β (step S25). Here, the second range identification reference value β shows the upper limit of the second range and is set, for instance, to 30%. If any one of the SOC 1, SOC 2, ..., SOC N is smaller than the second range identification reference value β; that is, if it is within the second range, the second determination unit 244 proceeds to step S26 in order to execute the deterioration determination (step S25; YES).

At step S26, the second determination unit 244 calculates the second deterioration level D2 of the respective battery blocks under the condition that the SOC is within the second range by respectively dividing the internal resistance values R1, R2, ..., RN calculated with the internal resistance detection unit 242 by the initial internal resistance value Ri (step S26).

Subsequently, the second determination unit 244 is initialized by substituting the variable M with 1 (step S27). The second determination unit 244 thereafter compares the second deterioration level D2 of the No. M battery block BM with the deterioration reference value ε (step S28). The deterioration reference value ε is obtained, for example, by preliminarily measuring the internal resistance value of the electrical battery 13 in which the deterioration has advanced and the charge-discharge current should be limited, and the internal resistance value of the electrical battery 13 in the initial state without any deterioration in a state where the SOC is charged to be within the second range, and dividing the internal resistance value of the deteriorated electrical battery 13 by the internal resistance value of the initial state. The deterioration reference value ε obtained as described above is stored in the ROM in advance.

If the second deterioration level D2 of the battery block BM is less than the deterioration reference value ε (step S28; NO), 1 is added to the variable M in order to perform the deterioration determination of the subsequent battery block (step S29), and the routine proceeds to step S30.

At step S30, the second determination unit 244 compares the variable M with the number of blocks N of the battery block B. If the variable M exceeds the number of blocks N (step S30; YES); that is, after the deterioration determination of all battery blocks is complete, the second determination unit 244 determines that the main determination processing ended normally and proceeds to step S33 and, after determining the non-deterioration of the secondary battery 10 and turning OFF the deterioration flag (step S33), ends this processing.

Meanwhile, at step S28, it is determined that the secondary battery 10 is of a deteriorated status in the main determination when the second determination unit 244 determines that the second deterioration level D2 is exceeding the deterioration reference value ϵ, the preliminary determination flag is turned ON (step S32), and the deterioration determination processing of the secondary battery 10 is thereby ended.

When the deterioration flag is turned ON, the charge-discharge control circuit 30 reduces, for instance, the charge-discharge current of the secondary battery 10. It is thereby possible to alleviate the reduction in safety of the power supply apparatus 1 caused by the deterioration of the secondary battery 10.

Based on the processing of steps S1 to S33 described above, the preliminary determination and the main determination of deterioration are respectively executed based on the internal resistance value of the secondary battery in the first and second ranges that are the SOC ranges in which the variation of the internal resistance of the secondary battery in relation to the variation of the SOC of that secondary battery is mutually different. Thus, since the secondary battery is ultimately determined to be deteriorated when the obtained internal resistance values both show the deterioration of the secondary battery respectively in a first range and a second range in which the variation in the internal resistance of the secondary battery in relation to the variation of the SOC is mutually different; that is, the level that the SOC of the secondary battery affects the internal resistance value is mutually different, the influence of the SOC on the ultimate deterioration determination result is reduced. Consequently, it is possible to improve the accuracy of the deterioration determination of the secondary battery.

In addition, influence from the calculation error of the internal resistance caused by the difference in current, voltage, and temperature is reduced, and the accuracy of the deterioration determination of the secondary battery 10 will improve. And if the accuracy of the deterioration determination is improved, then the control accuracy of the charge-discharge current by the charge-discharge control circuit 30 will also improve, and the safety of the power supply apparatus 1 can be improved thereby.

Moreover, since the second determination unit 244 executes the main determination of deterioration only if the preliminary determination flag is turned ON at step S21; that is, only when the first determination unit 243 determines that the secondary battery 10 is deteriorated in the preliminary determination, if the first determination unit 243 does not detect the deterioration of the secondary battery 10 in the preliminary determination, the second determination unit 244 does not execute the processing of steps S22 to S32. Thus, it is possible to reduce the amount of arithmetic processing required for the deterioration determination of the secondary battery.

If the second determination unit 244 is to execute the deterioration determination (step S28), since the secondary battery is determined to be of a deteriorated status in the preliminary determination by the first determination unit 243, if the second determination unit 244 determines that the secondary battery is of a deteriorated status at step S32, this means that the secondary battery was determined to be of a deteriorated status by the first determination unit 243 and determined to be of a deteriorated status by the second determination unit 244. In the foregoing case, the second determination unit 244 corresponds to an example of the final determination unit.

Incidentally, the configuration may also be such, without executing the processing of step S21, if the first determination unit 243 determines that the secondary battery is of a deteriorated status and the second determination unit 244 also determines that the secondary battery is of a deteriorated status, the final determination unit may ultimately determined that the secondary battery 10 is deteriorated and turn ON the deterioration flag.

Moreover, although a case was explained where the deterioration reference value is corrected according to the SOC of the secondary battery by properly using the deterioration reference value γ obtained from the electrical battery 13 in a state where the SOC is in the first range and the deterioration reference value ϵ from the electrical battery 13 in a state where the SOC is in the second range in the preliminary determination and the main determination, the deterioration reference value γ and the deterioration reference value ϵ may also be set to be of the same value showing deterioration in both the first and second ranges.

In addition, since the internal resistance value of the electrical battery 13 is dependent on temperature, it is preferably to reduce the influence of the temperature by correcting the deterioration reference values γ, ϵ according to the temperature T that was detected with the temperature detection unit 203.

Moreover, as shown in FIG. 2, although a case was explained where the SOC region in which the variation of the internal resistance of the secondary battery is smaller in relation to the change of the SOC was set as the first range, and the SOC region in which the variation of the internal resistance of the secondary battery is greater in relation to the change of the SOC was set as the second range, and the deterioration determination is preliminary performed in advance in the region in which the variation of the internal resistance of the secondary battery is smaller in relation to the change of the SOC, it is also possible to set the SOC region in which the variation of the internal resistance of the secondary battery is smaller in relation to the change of the SOC is set as the second range, set the SOC region in which the variation of the internal resistance of the secondary battery is greater in relation to the change of the SOC is set as the first range, and preliminary perform the deterioration determination in advance in the region in which the variation of the internal resistance of the secondary battery is greater in relation to the change of the SOC.

Moreover, the deterioration determination circuit 20 is not limited to being used in the power supply apparatus 1, and may also be used by being built into various equipment and devices that use a secondary battery. In addition, it is also possible to omit the control unit 204 and, for instance, cause the charge-discharge control circuit 30 to be installed with programs that realize the various types of processing as the SOC detection unit 241, the internal resistance detection unit 242, the first determination unit 243, and the second determination unit 244, and execute such programs.

Further, the deterioration determination of the secondary battery is not limited to being executed by the power supply apparatus 1. For example, upon obtaining information concerning the secondary battery 10 from the power supply apparatus 1, the deterioration determination may be performed with a terminal device such as a personal computer that is connected externally, or the deterioration determination may be performed with the generator 100 or the loading device 200, or by way of other methods. The embodiment disclosed above is merely an exemplification, and is not intended to limit the present invention in any way.

The foregoing deterioration determination circuit, the power supply apparatus, and the deterioration determination method of a secondary battery can be preferably used in the backup power supply apparatus of a photo voltaic system or UPS, as well as in the deterioration determination method and the deterioration determination circuit for determining the deterioration of the secondary battery, and their power supply apparatus in various equipment and devices that use a secondary battery such as portable personal computers, digital cameras, mobile phones, electric vehicles, hybrid cars and the like.

Specifically, the deterioration determination circuit according to one aspect of the present invention comprises an SOC detection unit for detecting an SOC of a secondary battery, an internal resistance detection unit for detecting an internal resistance value of the secondary battery, a first determination unit for determining the status of deterioration of the secondary battery based on the internal resistance value detected with the internal resistance detection unit if the SOC detected with the SOC detection unit is within a range of a pre-set first range, a second determination unit for determining the status of deterioration of the secondary battery based on the internal resistance value detected with the internal resistance detection unit if the SOC detected with the SOC detection unit is within a range of a pre-set second range as a range of an SOC in which the variation of the internal resistance of the second battery in relation to the variation of the SOC of the secondary battery is different from the first range, and a final determination unit for ultimately determining that the secondary battery is deteriorated if the first determination unit determines that the secondary battery is of the deteriorated status and the second determination unit additionally determines that the secondary battery is of the deteriorated status.

Moreover, the deterioration determination method of a secondary battery according to another aspect of the present invention comprises an SOC detection step of detecting an SOC of a secondary battery, an internal resistance detection step of detecting an internal resistance value of the secondary battery, a first determination step of determining the status of deterioration of the secondary battery based on the internal resistance value detected in the internal resistance detection step if the SOC detected in the SOC detection step is within a range of a pre-set first range, a second determination step of determining the status of deterioration of the secondary battery based on the internal resistance value detected in the internal resistance detection step if the SOC detected in the SOC detection step is within a range of a pre-set second range as a range of an SOC in which the variation of the internal resistance of the second battery in relation to the variation of the SOC of the secondary battery is different from the first range, and a final determination step of ultimately determining that the secondary battery is deteriorated if the first determination step determines that the secondary battery] is of the deteriorated status and the second determination step additionally determines that the secondary battery is of the deteriorated status.

According to this configuration, the status of deterioration of the secondary battery is determined based on the internal resistance value that was detected when the SOC of the secondary battery is within the range of the first range. Moreover, the status of deterioration of the secondary battery is determined based on the internal resistance value that was detected when the SOC of the secondary battery is within the range of the pre-set second range as the SOC range in which the variation of the internal resistance of the secondary battery in relation to the variation of the SOC of the secondary battery is different from the first range. Then, the secondary battery is ultimately determined to be deteriorated when the deterioration determination result based on the internal resistance value that was detected when the SOC is within the range of the first range and the deterioration determination result based on the internal resistance value that was detected when the SOC is within the range of the second range both show that the secondary battery is deteriorated.

The internal resistance value of the secondary battery, in addition to increasing pursuant to the advancement of the deterioration, in certain cases changes according to the SOC. Thus, according to the first determination unit (first determination step), the second determination unit (second determination step), and the final determination unit (final determination step), since the secondary battery is ultimately determined to be deteriorated when the obtained internal resistance values both show the deterioration of the secondary battery respectively in a first range and a second range in which the variation in the internal resistance of the secondary battery in relation to the variation of the SOC is mutually different; that is, the level that the SOC of the secondary battery affects the internal resistance value is mutually different, the influence of the SOC on the ultimate deterioration determination result is reduced. Consequently, it is possible to improve the accuracy of the deterioration determination of the secondary battery.

In addition, preferably, the second determination unit determines the status of deterioration when the first determination unit determines that the secondary battery is deteriorated, and the final determination unit ultimately determines that the secondary battery is deteriorated when the second determination unit determines that the secondary battery is deteriorated.

According to this configuration, since the second determination unit will not execute the processing of determining the status of deterioration if the first determination unit does not determine that the secondary battery is deteriorated, it is possible to reduce the processing of the second determination unit. Moreover, if the second determination unit determines that the secondary battery is deteriorated, since this means that the first determination unit has already determined that the secondary battery is deteriorated, the deterioration determination result of the secondary battery by the second determination unit can be used as is as the ultimate deterioration determination result of the secondary battery. Thus, it is possible to reduce the determination processing to be performed by the final determination unit.

Moreover, in the second range, the variation of the internal resistance of the secondary battery in relation to the variation of the SOC of that secondary battery is preferably greater than the first range.

In the first range in which the variation of the internal resistance of the secondary battery in relation to the variation of the SOC of that secondary battery is smaller than the second range, the change in the internal resistance associated with the deterioration from a non-deteriorated state will also be small. Thus, the determination accuracy of the determination based on the internal resistance value obtained in the first range will be lower than the determination accuracy of the determination based on the internal resistance value obtained in the second range. Thus, according to this configuration, if the first determination unit performs the deterioration determination of low accuracy and determines that the secondary battery is deteriorated, and the second determination unit additionally performs the deterioration determination of high accuracy, the possibility of ultimately obtaining an erroneous deterioration determination result can be reduced.

Moreover, in the second range, the variation of the internal resistance of the secondary battery in relation to the variation of the SOC of that secondary battery can also be smaller than the first range.

In the first range in which the variation of the internal resistance of the secondary battery in relation to the variation of the SOC of that secondary battery is greater than the second range, the change in the internal resistance associated with the deterioration from a non-deteriorated state will also be great. Thus, the determination accuracy of the determination based on the internal resistance value obtained in the first range will be higher than the determination accuracy of the determination based on the internal resistance value obtained in the second range. Thus, according to this configuration, since the second determination unit performs the deterioration determination of low accuracy only if the first determination unit performs the deterioration determination of high accuracy and determines that the secondary battery is deteriorated, the second determination unit will only execute processing in cases where the possibility of the secondary battery being ultimately determined to be deteriorated is high, and it is thereby possible to reduce the opportunities of executing the second determination unit, and amount of deterioration determination processing can also be reduced easily.

Moreover, preferably, the first determination unit determines that the secondary battery is deteriorated when the ratio of the internal resistance value detected with the internal resistance detection unit in relation to the internal resistance value when the secondary battery is not deteriorated exceeds a pre-set first deterioration reference value, and the second determination unit determines that the secondary battery is deteriorated when the ratio of the internal resistance value detected with the internal resistance detection unit in relation to the internal resistance value when the secondary battery is not deteriorated exceeds a pre-set second deterioration reference value.

There will be differences in the internal resistance value of the secondary battery due to individual differences. Thus, if the internal resistance value is directly compared with the determination reference value in order to determine the deterioration, it may reduce the determination accuracy of deterioration. Thus, according to this configuration, the first and second determination units perform the deterioration determination based on the ratio of the internal resistance value detected with the internal resistance detection unit in relation to the internal resistance value when the secondary battery is not deteriorated. Thus, as a result of the differences in the internal resistance value caused by the individual differences of the secondary battery, it is possible to improve the deterioration determination accuracy of the secondary battery.

In addition, the power supply apparatus according to yet another aspect of the present invention comprises the foregoing deterioration determination circuit, the foregoing secondary battery, and a charge-discharge control unit for controlling at least either the charge or discharge of the secondary battery in accordance with the determination result of the determination by the final determination unit.

According to this configuration, since the deterioration determination accuracy in the deterioration determination circuit will improve, at least either the charge or discharge of the secondary battery will be controller according to the deterioration determination result of high accuracy. Consequently, it will be possible to accurately reduce the reduction in safety in cases where the secondary battery is deteriorated.

In addition, the charge-discharge control unit preferably reduces the charge current and the discharge current of the secondary battery when the final determination unit ultimately determines that the secondary battery is deteriorated.

According to this configuration, since the charge current and the discharge current are reduced in cases where the secondary battery is deteriorated, it will be possible to improve the safety.

This application is based on Japanese Patent Application No. 2008-170498 filed on Jun. 30, 2008, the contents of which are hereby incorporated by reference.

Incidentally, the specific embodiments and examples provided in the foregoing detailed description of the preferred embodiments are merely explained to clarify the technical content of the present invention. Thus, the present invention should not be narrowly interpreted by being limited to such specific embodiments and examples, and may be variously modified and implemented within the spirit of this invention and the scope of claims provided below.

What is claimed is:

1. A deterioration determination circuit, comprising:
an SOC detection unit for detecting an SOC of a secondary battery;
an internal resistance detection unit for detecting an internal resistance value of the secondary battery;
a first determination unit for determining the status of deterioration of the secondary battery based on the internal resistance value detected by the internal resistance detection unit when the SOC detected by the SOC detection unit is within a range of a pre-set first range;
a second determination unit for determining the status of deterioration of the secondary battery based on the internal resistance value detected by the internal resistance detection unit when the SOC detected by the SOC detection unit is within a range of a pre-set second range as a range of an SOC, in which a variation of the internal resistance of the second battery in relation to a variation of the SOC of the secondary battery is different from the first range; and
a final determination unit for ultimately determining that the secondary battery is deteriorated when the first determination unit determines that the secondary battery is of the deteriorated status and the second determination unit additionally determines that the secondary battery is of the deteriorated status.

2. The deterioration determination circuit according to claim 1, wherein
the second determination unit determines the status of determination if the first determination unit determines that the secondary battery is deteriorated; and
the final determination unit ultimately determines that the secondary battery is deteriorated when the second determination unit determines that the secondary battery is deteriorated.

3. The deterioration determination circuit according to claim 2, wherein the second range exhibits a greater variation of the internal resistance of the second battery in relation to the variation of the SOC of the secondary battery than the first range.

4. The deterioration determination circuit according to claim 2, wherein the second range exhibits a smaller variation of the internal resistance of the secondary battery in relation to the variation of the SOC of the secondary battery than the first range.

5. The deterioration determination circuit according to claim 1, wherein
the first determination unit determines that the secondary battery is deteriorated when the ratio of the internal resistance value detected by the internal resistance detection unit in relation to the internal resistance value when the secondary battery is not deteriorated exceeds a pre-set first deterioration reference value; and
the second determination unit determines that the secondary battery is deteriorated when the ratio of the internal resistance value detected by the internal resistance detection unit in relation to the internal resistance value when the secondary battery is not deteriorated exceeds a pre-set second deterioration reference value.

6. A power supply apparatus, comprising:
the deterioration determination circuit according to claim 1;
the secondary battery; and
a charge-discharge control unit for controlling at least either the charge or discharge of the secondary battery in accordance with the determination result of the deterioration determination by the final determination unit.

7. The power supply apparatus according to claim 6, wherein the charge-discharge control unit reduces the charge current and discharge current of the secondary battery when the final determination unit ultimately determines that the secondary battery is deteriorated.

8. A deterioration determination method for a secondary battery, the method comprising:
an SOC detection step of detecting an SOC of a secondary battery;
an internal resistance detection step of detecting an internal resistance value of the secondary battery;
a first determination step of determining the status of deterioration of the secondary battery based on the internal resistance value detected in the internal resistance detection step when the SOC detected in the SOC detection step is within a range of a pre-set first range;
a second determination step of determining the status of deterioration of the secondary battery based on the internal resistance value detected in the internal resistance detection step when the SOC detected in the SOC detection step is within a range of a pre-set second range as a range of an SOC, in which a variation of the internal resistance of the second battery in relation to a variation of the SOC of the secondary battery is different from the first range; and
a final determination step of ultimately determining that the secondary battery is deteriorated when the first determination step determines that the secondary battery is of the deteriorated status and the second determination step additionally determines that the secondary battery is of the deteriorated status.

* * * * *